US007099990B2

(12) United States Patent
Blangy

(10) Patent No.: US 7,099,990 B2
(45) Date of Patent: Aug. 29, 2006

(54) METHOD OF UPDATING DATA FOR A NON-VOLATILE MEMORY

(75) Inventor: Hugues Blangy, Neuchatel (CH)

(73) Assignee: Em Microelectronic-Marin SA, Marin (CH)

( * ) Notice: Subject to any disclaimer, the term of this patent is extended or adjusted under 35 U.S.C. 154(b) by 358 days.

(21) Appl. No.: 10/820,951

(22) Filed: Apr. 9, 2004

(65) Prior Publication Data

US 2004/0205291 A1     Oct. 14, 2004

(30) Foreign Application Priority Data

Apr. 11, 2003   (EP)   ................... 03008452

(51) Int. Cl.
  *G06F 12/16*    (2006.01)
  *O06F 12/16*    (2006.01)
(52) U.S. Cl. .................. 711/103; 711/161; 711/162; 385/185.09
(58) Field of Classification Search ................ 711/103, 711/161, 162; 365/185.09
  See application file for complete search history.

(56) References Cited

U.S. PATENT DOCUMENTS

| 6,088,759 | A | * | 7/2000 | Hasbun et al. | ............... 711/103 |
| 6,414,876 | B1 | | 7/2002 | Harari et al. | |
| 6,493,807 | B1 | | 12/2002 | Martwick | |
| 2002/0002652 | A1 | * | 1/2002 | Takahashi | .................... 711/103 |
| 2002/0130334 | A1 | * | 9/2002 | Gastaldi et al. | ............. 257/200 |
| 2002/0188814 | A1 | * | 12/2002 | Saito et al. | ................. 711/159 |

FOREIGN PATENT DOCUMENTS

EP     0 649 095 A2     4/1995

OTHER PUBLICATIONS

European Search Report and mAnnex (2 pages) for the corresponding European application (in French), completed Sep. 8, 2003, by T. Ramcke, in Munich.
European Search Report and Annex (2 pages) for the corresponding European application (in English), completed Sep. 8, 2003, by T. Ramcke, in Munich.

* cited by examiner

*Primary Examiner*—Woo H. Choi
(74) *Attorney, Agent, or Firm*—Griffin & Szipl, P.C.

(57) ABSTRACT

The present invention concerns a data updating method for a non-volatile memory broken down into a plurality of similar memory subdivisions that can be erased independently of each other and among which at least two memory subdivisions (SRA, SRB) are reserved for updating data contained in each of said subdivisions (SM). The method implemented enables the execution time of an update to be reduced by simultaneously erasing the non-reserved memory subdivision (SM) to be updated and an unused reserved memory subdivision (SRB).

7 Claims, 2 Drawing Sheets

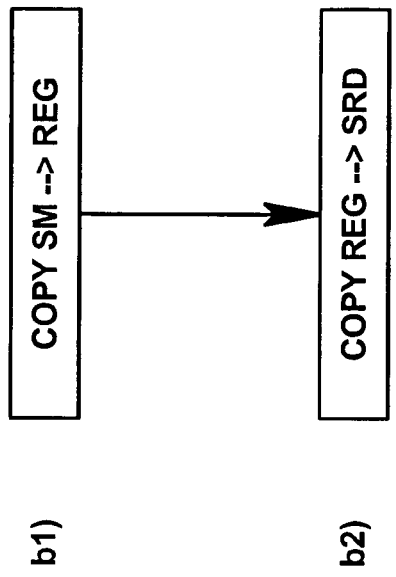
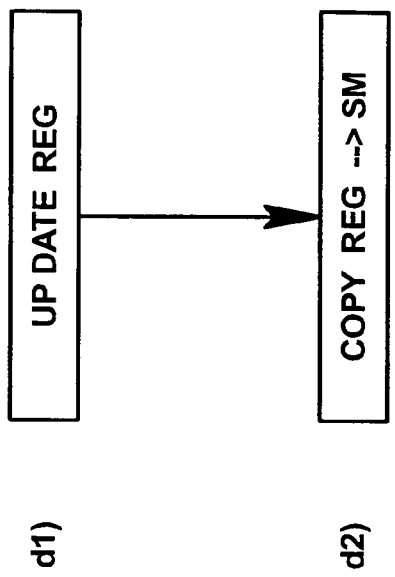
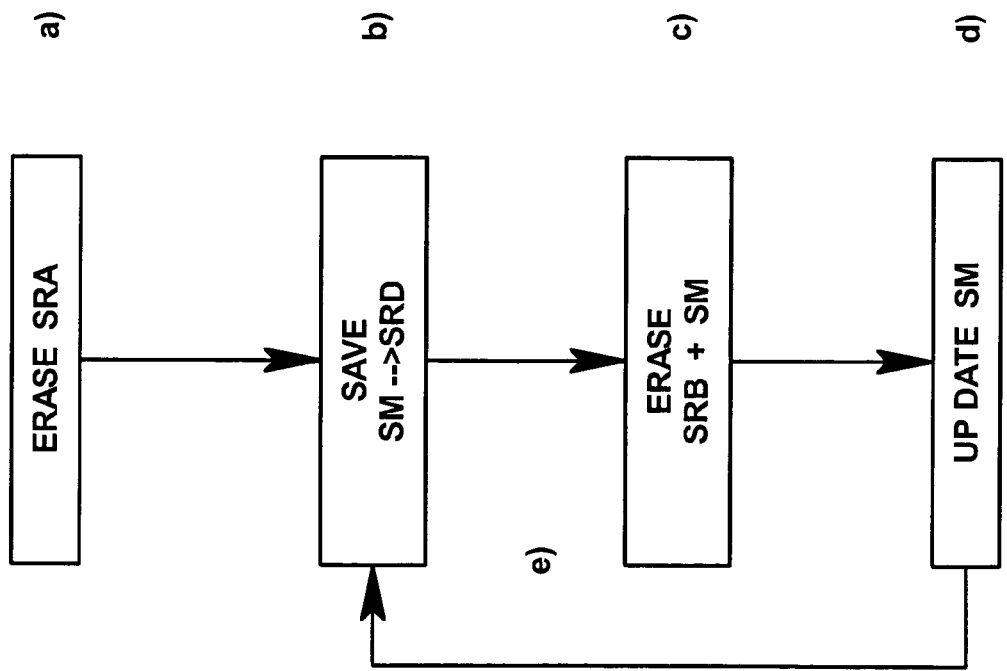

METHOD OF UPDATING DATA FOR A NON-VOLATILE MEMORY

This application claims priority from European Patent Application No. 03008452.9, filed Apr. 11, 2003, the entire disclosure of which is incorporated herein by reference.

FIELD OF THE INVENTION

The present invention relates to a method for updating data for a non-volatile memory of the EEPROM or Flash EEPROM type.

BACKGROUND OF THE INVENTION

Such non-volatile memories are formed by memory cells generally formed by a transistor with a floating gate able to contain binary data. The binary data of such a memory cell can take a first determined value, for example 0, by trapping hot electrons in the oxide layer isolating the transistor gate from the cell ("stacked gate" technology) or in the floating gate of the transistor ("split gate" technology). This relatively quick "write" or "programming" operation only requires, depending upon the technology used, for example a few microseconds. This binary data can take a second determined value, for example 1, via Fowler-Nordheim tunnel effect, which allows the passage, without ionisation, of a trapped electron through the oxide layer isolating the transistor gate ("stacked gate" technology) or from the floating gate ("split gate" technology). This "erasure" operation is considerably longer than that previously mentioned, it can last, for the same technology, for example, several milliseconds.

Depending upon the applications in which the memory is used, the latter can be broken down into a plurality of similar memory subdivisions that can be erased independently of each other. The size of these memory subdivisions can vary from that of a memory cell to that of a memory page of several kilos octets. In the particular case of a Flash memory, it is important to note that the programming operations can be carried out byte by byte, as for an EEPROM, but conversely, the erasure operations have to be carried out block by block, which means that an entire block has to be erased for each update of a single byte of said block.

A conventional data updating method for this type of memory generally includes the following steps:

- erasing a memory subdivision reserved for saving data;
- saving the data from a non-reserved memory subdivision to be updated to the previously erased reserved memory subdivision;
- erasing the non-reserved memory subdivision to be updated;
- updating the data in the memory subdivision erased in the preceding step;
- repeating the preceding steps at each new required updating.

First of all, it will be noted that the expression "erasure of a memory subdivision" is a shortcut expression frequently used to mean "deletion of data contained in a memory subdivision".

The use of a reserved non-volatile memory subdivision for saving data to be updated is necessary in order to guarantee that no loss of data can occur in the event of an abrupt interruption to the updating procedure due, for example, to a power cut. Moreover, the use of the same memory subdivision for containing the updated data is also necessary to ensure simple and quick access to the data by the memory management system. No data tracking, for example via a pointer, is then necessary.

The main drawback raised by the use of such a reserved memory subdivision is the increase in the execution length of the method when updates are carried out in series. Indeed, as seen in the introduction, the operations of "erasure" or setting the memory cells forming the memory subdivision to "1", are approximately 1000 times longer than a write operation. Since the method described hereinbefore has to carry out two erasure cycles for each update, a first to reserve a memory space for saving data, which allows warning to be given of any malfunction in the system implementing the method, and a second to be able to carry out the update in the subdivision which contained the data prior to the update. Thus, the execution time of this type of method soon becomes critical particularly because it monopolises the system's resources during its implementation.

SUMMARY OF THE INVENTION

The updating method, according to one implementation of the invention, not only allows one to guard against data loss in the event of a malfunction during implementation, and ensures simple and quick access to data, but also enables its execution time to be optimised.

In order to do this, the method is implemented for a non-volatile memory broken down into a plurality of similar memory subdivisions that can be erased independently of each other and among which at least two memory subdivisions are reserved for updating data contained in each of said subdivisions, the method being characterized in that it includes the following steps:

a) erasing a first reserved memory subdivision if none of said reserved memory subdivisions has been erased beforehand;
b) saving the data from a non-reserved memory subdivision to be updated in said first erased reserved memory subdivision or in a previously erased reserved memory subdivision;
c) simultaneously erasing said non-reserved memory subdivision and a second reserved memory subdivision;
d) updating the data from said non-reserved memory subdivision;
e) reiterating steps b) to d) for all the other non-reserved memory subdivisions to be updated.

The use of at least two reserved memory subdivisions for saving data advantageously allows a first subdivision to be used for storing the data to be updated and at least a second subdivision, which is erased concurrently with the subdivision to be updated. Thus, for all the subsequent updates carried out a reserved memory subdivision is always available, which means that erasure of a reserved subdivision can be omitted from step a) of the method. It will be noted in this regard that the two memory subdivisions reserved for saving data can be replaced in an equivalent manner by non-volatile buffers that are external to the non-volatile memory containing the data.

As was explained hereinbefore, the fact of updating data from a subdivision in the same subdivision has the advantage of knowing the location of said data in advance and thus does not require any complex data tracking system, such as for example, a non-volatile pointer table. Data access is thus simple and quick.

However, in the event of an unexpected interruption to the method during implementation thereof, in order to be able easily to restore the data of a subdivision that is being updated as they were before, it is advantageous to know the location of the saved data. Within the scope of the prior art, the solution was obvious, because of the use of a single reserved subdivision. However, within the scope of the method according to the previously stated implementation, it is imperative to make use of at least two subdivisions in order to obtain the required time saving. This is why these reserved subdivisions are advantageously provided with a non-volatile control sector for directly determining which subdivision being updated corresponds to the data contained in a reserved subdivision.

In order to optimise the restoration procedure in the event of interruption, CRC ("cyclic redundancy check") type means for checking the proper execution of the method during its implementation are advantageously provided, in order to define stop points for knowing precisely the moment when the method is interrupted.

Other implementations of the updating method and advantageous variants are set out in the dependent claims.

BRIEF DESCRIPTION OF THE DRAWINGS

Other features and advantages of the invention will appear in the course of the following description, given solely by way of example and made with reference to the annexed drawings, in which:

FIG. 1 shows a diagram of the steps of the updating method according to a first implementation of the invention;

FIG. 1A shows an example of a detail of step b) of the method according to the first implementation;

FIG. 1B shows an example of a detail of step d) of the method according to the first implementation.

Figure 2:
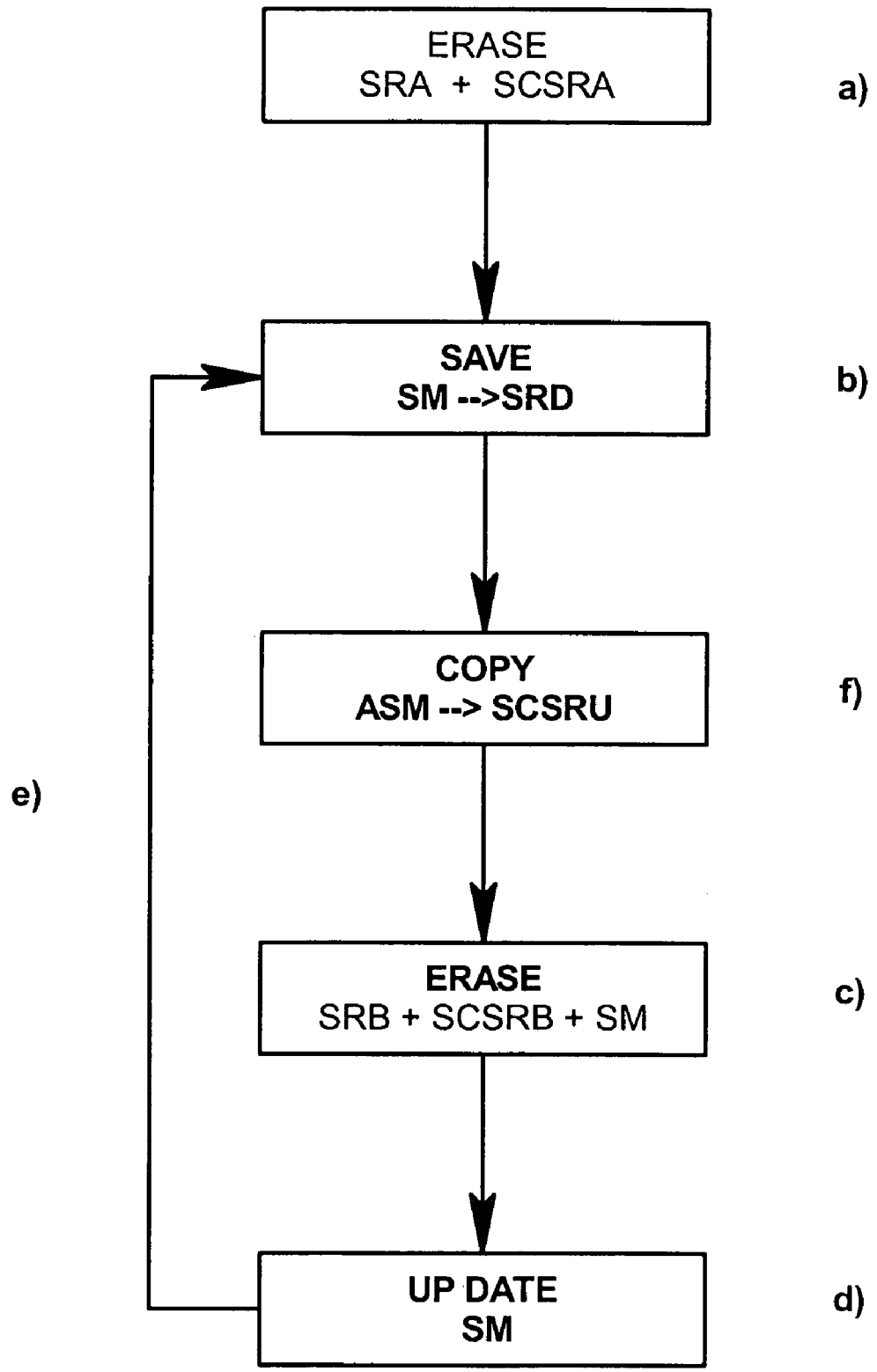
FIG. 2 shows a diagram of the steps of the method according to a second implementation of the invention.

DETAILED DESCRIPTION OF THE
ILLUSTRATIVE EMBODIMENTS

In the following description, the data updating method according to the various implementations of the invention, relates to a non-volatile memory, preferably of the Flash EEPROM type, divided into a plurality of similar memory subdivisions (SM) that are erasable independently of each other. At least two memory subdivisions are reserved (SRA, SRB) for saving data. However, one could envisage replacing these at least two reserved memory subdivisions that are internal to the memory, by at least two external non-volatile buffers of similar size to those of the memory subdivisions.

According to a first implementation of the data updating method, shown in FIG. 1, during a first initialisation step a) at least one of the reserved memory subdivisions (SRA) is erased, if none of them has already been erased. Once this initialisation step has been carried out, for each updating of a memory subdivision, the method enables an erasure time to be saved.

During the second step b), one of the non-reserved memory subdivisions (SM) whose data has to be updated is saved in the reserved memory subdivision erased in the preceding step or in one of the previously erased reserved memory subdivisions, i.e. in an available reserved memory subdivision (SRD). An execution example of such a save step can be carried out as shown in FIG. 1A. In this case, the save step is broken down into a first sub-step b1) consisting in copying the data to be updated from the memory subdivision (SM) into one or more registers (REG) depending upon the size of the subdivision, or into any quickly accessible volatile memory space, the content of its registers then being recopied into the available reserved memory subdivision (SRD) during a second sub-step b2).

Once the second step b) has been carried out, it is certain that the initial content prior to updating can be recovered even in the event of an abrupt interruption to the method since its initial content is stored in a non-volatile reserved memory subdivision. This is why, the step consisting in erasing the non-reserved memory subdivision to be updated (SM) can be carried out in complete security.

During implementation of the method according to the invention, at the third step c), the non-reserved subdivision to be updated (SM) and a reserved memory subdivision (SRB) different from that containing the data to be updated, are erased concurrently. Given that the two erasure operations are carried out simultaneously, the total time of these two operations is equivalent to the execution time of a single erasure operation.

It will be noted thus that the reserved memory subdivision (SRB) erased at step c) will be used for the next update as the available reserved memory subdivision (SRD).

Once step c) has been carried out, since the memory subdivision (SM) to be updated has been erased, it is possible to copy into it the data to be updated. Step d) for updating data of the memory subdivision to be updated can be broken down into two sub-steps d1) and d2), as shown in FIG. 1B. The first sub-step d1) consists in updating the data contained in the registers (REG) used in step b) and correspond to the data contained previously by the non-reserved subdivision to be updated.

It will be noted in this regard that this step d1) for updating the data contained in the registers (REG) can be carried out as soon as step b2) of recopying said data into the available reserved memory subdivision (SRD) has finished and at the latest before step d2) which consists in recopying the data updated in the registers from the latter into the memory subdivision (SM) to be updated. It is important to note that the same memory subdivision is advantageously used for updating as that which was erased in step c). This allows simple and quick access to the data to be updated without requiring the use of a data tracking method.

Finally for all subsequent updates, step a) is no longer carried out because at least one reserved memory subdivision has already been erased during step c) of the preceding update. Thus, during subsequent updates, step e), only steps b) to d) are carried out again, namely a single erasure step c), which leads to a considerable time saving during execution.

According to a second implementation of the method, shown in FIG. 2, each of the reserved memory subdivisions is associated with a checking sector (SCSR). Each checking sector is for determining whether the associated reserved memory subdivision (SRU) is being used in the sense that it contains data or whether the reserved subdivision (SRD) in question is available, in the sense that it has been erased beforehand.

Advantageously, the size of this checking sector depends upon the number of non-reserved memory subdivisions (SM) capable of being updated. Thus, for example, for a memory containing 62 non-reserved memory subdivisions, at least 6 bits will have to be provided for a checking sector, so as to be able to indicate the number of the subdivision to be updated corresponding to its address in the memory. Thus, reading this checking sector provides knowledge not only as to whether data is contained in the associated reserved memory subdivision, but also as to which non-reserved memory subdivision to be updated said data corresponds.

According to this second implementation, the first initialisation step a) differs from that carried out in the first implementation, in that it consists in erasing not only a reserved memory subdivision (SRA) if none of them have been erased beforehand, but also in simultaneously erasing the checking sector (SCSRA) associated with said reserved memory subdivision. Since these erasure operations are carried out at the same time, there is no resulting loss of time with respect to step a) of the first embodiment. Moreover, this operation has the advantage of being able to determine quickly and simply which reserved memory subdivision is available (SRD) solely by reading the checking sectors (SCSR) of the reserved memory subdivisions.

Step b) is similar to that described with reference to the first implementation of the method and will not therefore be repeated here.

Once step b) has been carried out, an additional step f) is carried out. This step f) consists in registering a data item in the checking sector (SCSRU) of the reserved memory subdivision previously used during step b), indicating the use of the latter. In the advantageous case in which the size of the checking sector is adapted to the number of non-reserved memory subdivisions, the data item registered corresponds to the number or the address of the non-reserved subdivision to be updated (SM).

Thus, in the event of an abrupt interruption to the method, the content of the various checking sectors of the reserved memory sectors (SCSR) need simply to be read to determine first of all, the one which contains data that possibly has not been able to be validly updated and secondly, the non-reserved memory subdivision to which the valid data of the reserved memory subdivision corresponds.

Step c) differs from that carried out in the first implementation in that it consists in simultaneously erasing not only a different reserved memory subdivision (SRB) from that used for saving the non-reserved memory subdivision to be updated, as well as the latter, but also the checking sector (SCSRB) associated with this other reserved memory subdivision (SRB). There is no resulting loss of time with respect to step c) of the first implementation. Moreover, this operation has the advantage of being able to determine quickly and simply which reserved memory subdivision is available (SRD) for the next update and particularly during step b) of the subsequent update.

Step d) is similar to that described with reference to the first implementation of the method and will not, therefore, be repeated here.

Step e) consists in reiterating all the steps from step b) to step d) including of course the additional step f), for each subsequent update.

According to a variant of the second implementation of the method, all of the checking sectors (SC) of the reserved memory subdivisions are grouped together in the same memory zone in order to facilitate consultation.

It is clear that other implementations of the updating method can be envisaged, provided the data is still recoverable even in the event of an interruption to the method, that the location of said data is still easily determinable, and that the duration of an update is minimal in the sense that the erasure of the reserved and non-reserved subdivisions is carried out simultaneously.

It will also be noted that it is possible to provide an additional step consisting in programming the checking sector to 0, to indicate that the programming or write operation carried out for the update has been carried out without any errors.

It will be noted finally that it is necessary to find a good compromise between the number of reserved and non-reserved memory subdivisions. Indeed, it is advantageous to have a minimum of reserved memory subdivisions, namely at least 2, in order to have a maximum useful memory space. Conversely, it is also advantageous to have a significant number of reserved memory subdivisions in order to extend the lifetime of the memory, the number of erasure cycles being limited for each subdivision. An efficient compromise is to use ⅛th of the memory space for the reserved memory subdivisions.

What is claimed is:

1. A method for updating data for a non-volatile memory broken down into a plurality of similar memory subdivisions that can be erased independently of each other and among which at least two memory subdivisions are reserved for updating data contained in each of said subdivisions, wherein the method includes the following steps:
    a) erasing a first reserved memory subdivision if none of said reserved memory subdivisions has been erased beforehand;
    b) saving the data from a non-reserved memory subdivision to be updated in said first erased reserved memory subdivision or in a previously erased reserved memory subdivision;
    c) simultaneously erasing said non-reserved memory subdivision and a second reserved memory subdivision;
    d) updating the data in said non-reserved memory subdivision;
    e) reiterating steps b) to d) for all the other non-reserved memory subdivisions to be updated.

2. The method according to claim 1, wherein the step b) is broken down into two sub-steps:
    b1) copying the data from the non-reserved memory subdivision into external volatile storage means; and
    b2) copying the data from said external volatile storage means into said first erased reserved memory subdivision or into said previously erased reserved memory subdivision.

3. The method according to claim 2, wherein step d) is broken down into two sub-steps:
    d1) updating the data contained in the external volatile storage means used in step b);
    d2) copying the updated data from the external volatile storage means into the memory subdivision to be updated.

4. The method according to claim 1, wherein a checking sector is associated with each of the reserved memory subdivisions, wherein
    during step a), a checking sector associated with the first erased reserved memory subdivision, is simultaneously erased if none of the reserved memory subdivisions have been erased beforehand;
    during step c), a checking sector associated with the second erased reserved memory subdivision, is simultaneously erased;
    the method includes an additional step f) carried out between steps b) and c) consisting in:
    f) registering a data item in a checking sector of the reserved memory subdivision used previously during step b), indicating the use of the latter.

5. The method according to claim 4, wherein the size of the checking sector of each of the reserved memory subdivisions is adapted to the number of non-reserved memory subdivisions and in that the additional step f) the consists in:

f) registering the number or the address of the non-reserved subdivision to be updated in the checking sector of the reserved memory subdivision previously used during step b).

6. The method according to claim 1, wherein a cyclical redundant check is implemented parallel to the method.

7. The method according to claim 1, wherein the number of reserved memory subdivisions corresponds to ⅛th of the number of non-reserved memory subdivisions.

* * * * *